(12) United States Patent
Hong et al.

(10) Patent No.: US 9,832,858 B2
(45) Date of Patent: Nov. 28, 2017

(54) DISPLAY DEVICE

(71) Applicant: SAMSUNG DISPLAY CO., LTD., Yongin, Gyeonggi-Do (KR)

(72) Inventors: Sangmin Hong, Yongin (KR); Jungi Youn, Yongin (KR); Goeun Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/711,223

(22) Filed: May 13, 2015

(65) Prior Publication Data
US 2016/0126487 A1    May 5, 2016

(30) Foreign Application Priority Data
Oct. 31, 2014  (KR) .................. 10-2014-0150632

(51) Int. Cl.
| | |
|---|---|
| *H05K 1/11* | (2006.01) |
| *H05K 1/02* | (2006.01) |
| *H01L 51/00* | (2006.01) |
| *H01L 51/52* | (2006.01) |
| *G02F 1/1339* | (2006.01) |
| *H01L 27/32* | (2006.01) |

(52) U.S. Cl.
CPC ......... *H05K 1/0212* (2013.01); *G02F 1/1339* (2013.01); *H01L 51/0024* (2013.01); *H01L 51/529* (2013.01); *H01L 51/5246* (2013.01); *H01L 27/3246* (2013.01); *H01L 51/525* (2013.01)

(58) Field of Classification Search
CPC . H01L 51/5246; H01L 51/524; H01L 51/529; B32B 7/12; H05K 1/141
See application file for complete search history.

(56) References Cited

U.S. PATENT DOCUMENTS

| | | | |
|---|---|---|---|
| 2010/0102719 A1 | 4/2010 | Lee et al. | |
| 2011/0057208 A1 | 3/2011 | Jeon et al. | |
| 2012/0235557 A1 | 9/2012 | Lee | |
| 2012/0319123 A1* | 12/2012 | Han | H01L 51/5246 257/72 |
| 2014/0027743 A1* | 1/2014 | Nishido | H01L 51/5253 257/40 |

FOREIGN PATENT DOCUMENTS

| | | |
|---|---|---|
| KR | 10-2002-0016494 A | 3/2002 |
| KR | 10-2010-0047585 | 5/2010 |
| KR | 10-2011-0020613 A | 3/2011 |
| KR | 10-2011-0027115 | 3/2011 |
| KR | 10-2012-0010068 A | 2/2012 |
| KR | 10-2012-0105252 | 9/2012 |

* cited by examiner

*Primary Examiner* — Robert J Hoffberg
*Assistant Examiner* — Hung Dang
(74) *Attorney, Agent, or Firm* — Lee & Morse, P.C.

(57) ABSTRACT

A display device includes a first substrate, a second substrate that covers the first substrate, a sealing member between the first and second substrates, the sealing member bonding the first and second substrates to each other, and one or more heating parts between the first substrate and the sealing member to apply heat to the sealing member during a sealing process of bonding the first and second substrates to each other.

9 Claims, 6 Drawing Sheets

DISPLAY DEVICE

CROSS-REFERENCE TO RELATED APPLICATION

Korean Patent Application No. 10-2014-0150632, filed on Oct. 31, 2014, in the Korean Intellectual Property Office, and entitled: "Display Device," is incorporated by reference herein in its entirety.

BACKGROUND

1. Field

Embodiments relate to a display device.

2. Description of the Related Art

Display devices such as organic light-emitting display devices including thin-film transistors (TFTs) may be used for mobile devices, such as smartphones, tablet personal computers, super-slim laptop computers, digital cameras, video cameras, and portable information terminals, and electronic/electric products such as super-slim televisions.

SUMMARY

Embodiments are directed to a display device including a first substrate, a second substrate that covers the first substrate, a sealing member between the first and second substrates, the sealing member bonding the first and second substrates to each other, and one or more heating parts between the first substrate and the sealing member to apply heat to the sealing member during a sealing process of bonding the first and second substrates to each other.

A plurality of the heating parts may be positioned between the first substrate and the sealing member such that the plurality of the heating parts are spaced from each other by a predetermined space.

Widths of the plurality of the heating parts may be equal.

Widths of the plurality of the heating parts may be different from each other.

The display device may further include an insulating layer between the first substrate and the sealing member. One or more heating parts may be positioned between the insulating layer and the sealing member The display device may further include a plurality of insulating layers between the first substrate and the sealing member. One or more heating parts may be positioned between the plurality of insulating layers.

The display device may further include one pair of electrode parts connected to both ends of each of the one or more heating parts. Heat may be generated by the one or more heating parts due to a difference between voltages applied by the one pair of electrode parts to the both ends of each of the one or more heating parts.

One or more heating parts may be in a form of a single-layer or multi-layer film including at least one selected from the group of gold (Au), silver (Ag), copper (Cu), nickel (Ni), platinum (Pt), palladium (Pd), aluminum (Al), molybdenum (Mo), chromium (Cr), a Ni:Cu-group alloy, and a Cu:Ni:manganese (Mn)-group alloy.

The first substrate may include a display area, a sealing area in which the sealing member is positioned, and a cutting area extending outwardly from the sealing area. The one pair of electrode parts may be positioned in the cutting area such as to be removable together with the cutting area after the sealing process.

An opening may be between the plurality of the heating parts. The opening may be filled with the sealing member.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
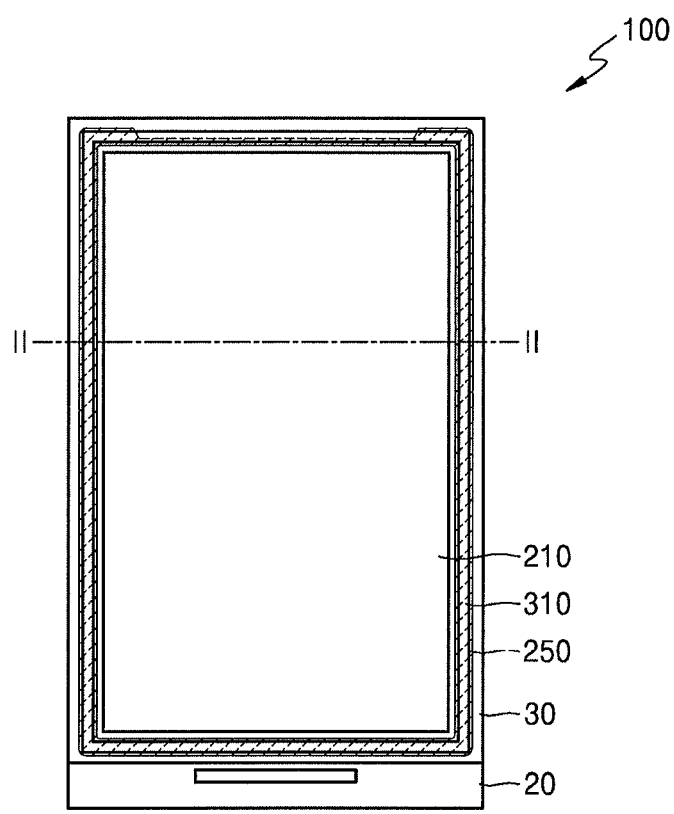
FIG. 1 illustrates a schematic top view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

Figure 2:
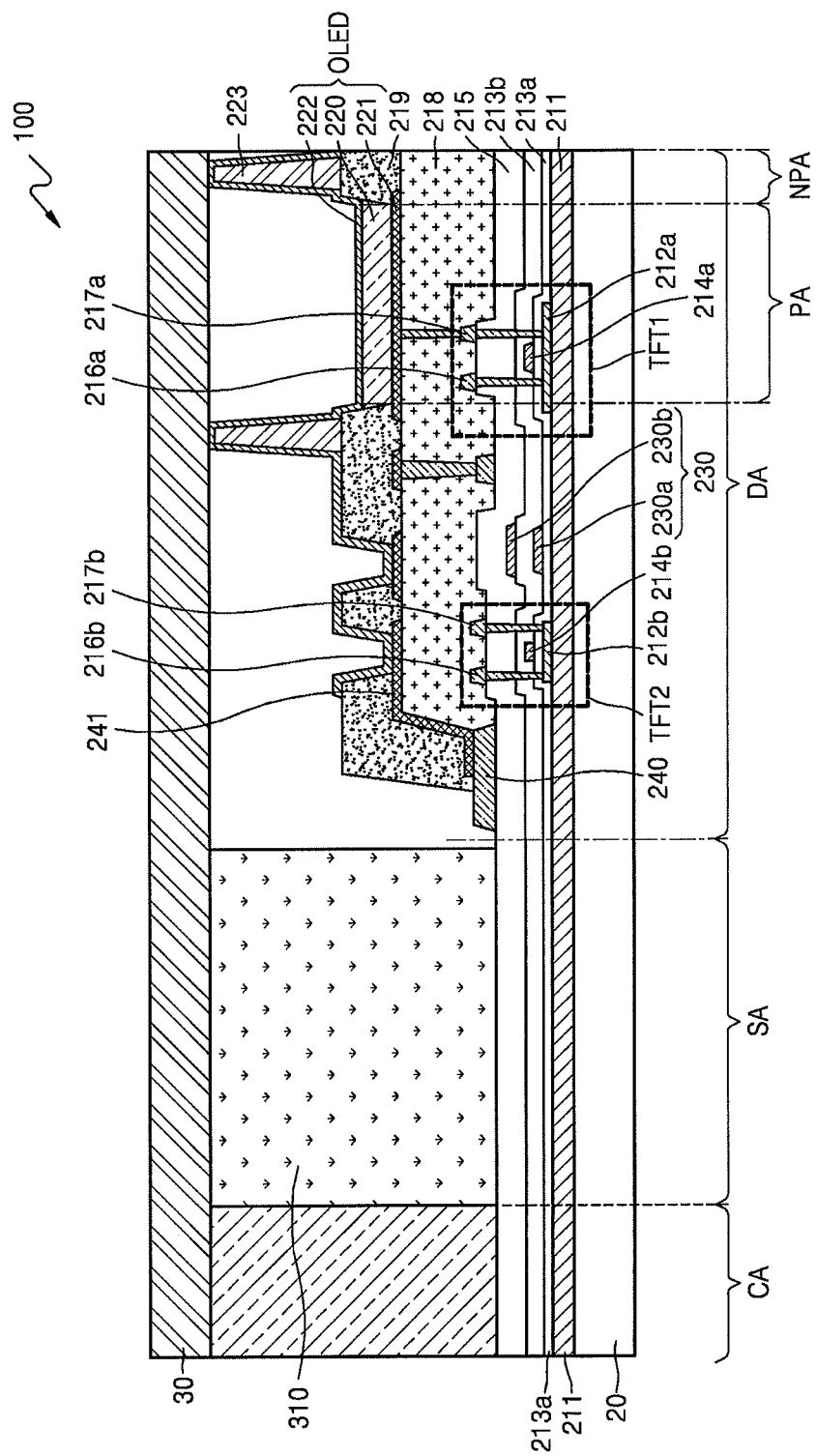
FIG. 2 illustrates a cross-sectional view along line of the display device of FIG. 1.

FIG. 1 illustrates a schematic top view of a display device 100 according to an embodiment. FIG. 2 illustrates a cross-sectional view along line II-IF of the display device 100 of FIG. 1.

In the present embodiment, it is illustrated that the display device 100 is an organic light-emitting display device. In some implementations, the display device 100 may be a liquid crystal display (LCD) device, a field emission display (FED) device, an electronic paper display (EPD) device, or the like.

Referring to FIGS. 1 and 2, the display device 100 may include a first substrate 20, a second substrate 30 facing the first substrate 20, and a sealing member 310 positioned between the first substrate 20 and the second substrate 30 to bond the first substrate 20 and the second substrate 30 to each other.

A display element 210 may be provided on the first substrate 20. The first substrate 20 may be a rigid glass substrate, a polymer substrate, a flexible film, a metal substrate, or a combination thereof. The display element 210 may be a display element that provides an image, such as an organic light-emitting diode OLED, a liquid display element, an electrophoresis display element, or the like.

The display device 100 may have a display area DA where an image is to be displayed, a sealing area SA for sealing the display area DA, and a cutting area CA for separating the display device 100 into individual display devices.

A buffer layer 211 may be further included on the first substrate 20. The buffer layer 211 may prevent a spread of impurity ions in an upper surface of the first substrate 20, prevent infiltration of humidity and external air, and planarize the upper surface of the first substrate 20. According to one or more embodiments, the buffer layer 211 may be formed of an inorganic material, such as silicon oxide, silicon nitride, silicon oxynitride, aluminum oxide, aluminum nitride, titanium oxide, titanium nitride, or the like, or an organic material, such as polyimide, polyester, acryl, or the like, or a stacked body thereof. In some implementations, the buffer layer 211 may be omitted. The buffer layer 211 may be formed by various deposition methods, such as a plasma enhanced chemical vapor deposition (PECVD) method, an atmospheric pressure CVD (APCVD) method, a low pressure CVD (LPCVD) method, or the like.

In the display area DA, the display element 210 for realizing an image is disposed. The display element 210 may be the organic light-emitting diode OLED, a liquid display element, or an electrophoresis display element, as examples. According to FIG. 2, the display element 210 will be described using the organic light-emitting diode OLED as an example.

A first thin-film transistor TFT1 may include a first active layer 212a, a first gate electrode 214a, a first source electrode 216a, and a first drain electrode 217a. A first gate insulating layer 213a may be interposed between the first gate electrode 214a and the first active layer 212a to insulate therebetween. The first gate electrode 214a may be formed on the first gate insulating layer 213a such that the first gate electrode 214a overlaps with a portion of the first active layer 212a. The first thin-film transistor TFT1 may be a driving thin-film transistor disposed below the organic light-emitting diode OLED to drive the organic light-emitting diode OLED.

A second thin-film transistor TFT2 may include a second active layer 212b, a second gate electrode 214b, a second source electrode 216b, and a second drain electrode 217b. The first gate insulating layer 213a may be interposed between the second gate electrode 214b and the second active layer 212b to insulate therebetween. The second gate electrode 214b may be formed on the first gate insulating layer 213a such that the second gate electrode 214b overlaps with a portion of the second active layer 212b.

The first active layer 212a and the second active layer 212b may be provided on the buffer layer 211. The first active layer 212a and the second active layer 212b may be formed using an inorganic semiconductor formed of amorphous silicon poly silicon, or the like or using an organic semiconductor. According to one or more embodiments, the first active layer 212a may be formed using an oxide semiconductor. For example, the oxide semiconductor may include an oxide of a material selected from among 12-, 13-, and 14-group metallic elements, such as zinc (Zn), indium (In), gallium (Ga), tin (Sn), cadmium (Cd), germanium (Ge), and hafnium (Hf), and a combination thereof.

The first gate insulating layer 213a may be provided on the buffer layer 211 and may cover the first active layer 212a and the second active layer 212b. A second gate insulating layer 213b may cover the first gate electrode 214a and the second gate electrode 214b.

The first gate electrode 214a and the second gate electrode 214b may include a single-layer or multi-layer film of gold (Au), silver (Ag), copper (Cu), nickel (Ni), platinum (Pt), palladium (Pd), aluminum (Al), molybdenum (Mo), chromium (Cr), or the like, or an alloy, such as Al:neodymium (Nd). Mo:tungsten (W), or the like.

The first gate insulating layer 213a and the second gate insulating layer 213b may include an inorganic layer, such as silicon oxide, silicon nitride, metal oxide. The first gate insulating layer 213a and the second gate insulating layer 213b may be formed as single layer or as multiple layers thereof.

An interlayer insulating layer 215 may be formed on the second gate insulating layer 213b. The interlayer insulating layer 215 may be formed of an inorganic layer, such as silicon oxide, silicon nitride, or the like. The interlayer insulating layer 215 may include an organic layer.

The first source electrode 216a and the first drain electrode 217a may be formed on the interlayer insulating layer 215. Each of the first source electrode 216a and the first drain electrode 217a may contact the first active layer 212a via a contact hole. In addition, the second source electrode 216b and the second drain electrode 217b may be formed on the interlayer insulating layer 215. Each of the second source electrode 216b and the second drain electrode 217b may contact the second active layer 212b via a contact hole. The first source electrode 216a, the first drain electrode 217a, the second source electrode 216b, and the second drain electrode 217b may include a metal, an alloy, a metal nitride, a conductive metal oxide, a transparent conductive material, or the like.

In some implementations, various other types of thin-film transistor structures may be used. For example, although the first thin-film transistor TFT1 is depicted as being a top gate structure, in some implementations, the first thin-film transistor TFT1 may be formed as a bottom gate structure in which the first gate electrode 214a is disposed below the first active layer 212a.

A capacitor 230 may be included in the display area DA. The capacitor 230 may store a data signal to be provided to the display element 210 or compensates for a voltage drop of the display element 210.

The capacitor 230 may include a first capacitor electrode 230a, a second capacitor electrode 230b, and the second gate insulating layer 213b between the first capacitor electrode 230a and the second capacitor electrode 230b. The first capacitor electrode 230a may be formed of the same material as that of the second gate electrode 214b, and the second capacitor electrode 230b may be formed of the same material as that of the first gate electrode 214a.

A planarization layer 218 may be provided on the interlayer insulating layer 215 such that the planarization layer 218 covers the first and second thin-film transistors TFT1 and TFT2. The planarization layer 218 may remove a level difference between layers and may planarize surfaces of the layers in order to increase emission efficiency of the organic light-emitting diode OLED. The planarization layer 218 may have a through hole through which a portion of the first drain electrode 217a is exposed.

The planarization layer 218 may be provided as an insulating body. For example, the planarization layer 218 may be formed in a single-layer or multi-layer structure by using an inorganic material, an organic material, or an organic/inorganic compound and may be formed by a suitable deposition method. According to one or more embodiments, the planarization layer 218 may be formed of one or more materials selected from the group of a polyacrylate resin, an epoxy resin, a phenolic resin, a polyamide resin, a polyimide resin, an unsaturated polyesters resin, a poly phenylenether resin, a polyphenylene sulfide resin, and benzocyclobutene (BCB).

In some implementations, any one of the planarization layer 218 and the interlayer insulating layer 215 may be omitted.

The organic light-emitting diode OLED may be disposed on the planarization layer 218 and may include a first electrode 221, an intermediate layer 220 including an organic emission layer, and a second electrode 222. A pixel-defining layer 219 may be disposed such that the pixel-defining layer 219 covers a portion of planarization layer 218 and the first electrode 221, and defines a pixel area PA and a non-pixel area NPA.

Holes and electrons injected from the first electrode 221 and the second electrode 222, respectively, of the organic light-emitting diode OLED may recombine in the organic emission layer, thereby emitting light.

The intermediate layer 220 may include the organic emission layer. The intermediate layer 220 may further include various functional layers. For example, the intermediate layer 220 may include the organic emission layer and may further include at least one selected from the group of a hole injection layer (HIL), a hole transport layer (HTL), an electron transport layer (ETL), and an electron injection layer (EIL).

The second electrode 222 may be formed on the intermediate layer 220. The second electrode 222 may form an electric field together with the first electrode 221 to thereby allow the intermediate layer 220 to emit light. The first electrode 221 may be patterned for each pixel. The second electrode 222 may be formed to apply a common voltage to all pixels. The second electrode 222 may be electrically connected via a circuit wiring 241 to a power wiring 240 disposed an edge of the display area DA.

The first electrode 221 and the second electrode 222 may be provided as a transparent electrode or a reflective electrode. The first electrode 221 may act as an anode, and the second electrode 222 may act as a cathode. In other implementations, the first electrode 221 may act as a cathode, and the second electrode 222 may act as an anode.

Although only one organic light-emitting diode OLED is shown in FIG. 2, a plurality of organic light-emitting diodes OLED may be included in the display area DA. One pixel per organic light-emitting diode OLED may be formed, and each pixel may emit red, green, blue, or white light.

A protective layer may be disposed on the second electrode 222 to cover and protect the organic light-emitting diode OLED. The protective layer may be formed using an inorganic insulating layer and/or an organic insulating layer.

A spacer 223 may be disposed between the first substrate 20 and the second substrate 30 and maintain a gap therebetween. The spacer 223 may be provided so that a display characteristic is not deteriorated regardless of an external shock.

According to one or more embodiments, the spacer 223 may be formed on the pixel-defining layer 219. The spacer 223 may protrude from the pixel-defining layer 219 towards the second substrate 30. According to one or more embodiments, the pixel-defining layer 219 and the spacer 223 may be formed as one body through a photography process or a photo-etching process using a photosensitive material. The pixel-defining layer 219 and the spacer 223 may be formed at the same time by adjusting a light-exposure amount through a light-exposure process using a halftone mask.

The second electrode 222 and/or the protective layer may be disposed on the spacer 223.

The second substrate 30 may be formed of a transparent member. Accordingly, an image realized by the display element 210 may be exposed to the outside through the second substrate 30. According to one or more embodiments, the second substrate 30 may further include an on-cell touch screen panel on which a touch screen pattern is formed such that the second substrate 30 may act as a touch panel.

A polarizing film, a color filter, and/or a protective window may be further included on the second substrate 30.

In the sealing area SA, the sealing member 310 may be disposed between the first substrate 20 and the second substrate 30 such that the sealing member 310 surrounds the display element 210, and seals an internal space between the first substrate 20 and the second substrate 30. The sealing member 310 may help to prevent oxygen, humidity, or the like from flowing into the internal space in which the display element 210 is formed. The sealing member 310 may stably bond the first substrate 20 and the second substrate 30, thereby improving a mechanical strength of the display device 100. A hygroscopic agent, a filler, or the like may be located in the internal space between the first substrate 20 and the second substrate 30.

The sealing member 310 may be an inorganic material. For example, the sealing member 310 may be a glass frit. The sealing member 310 may be formed by coating the glass frit by a dispenser or a screen printing method. The term "glass frit" may indicate a powder-shaped glass raw material. In some implementations, the glass frit may include a paste in which a laser or infrared absorbent, an organic binder, a filler for reducing a thermal expansion coefficient, or the like is added to a main material such as silicon oxide ($SiO_2$) or the like. The first substrate 20 and the second substrate 30 may be bonded by irradiating a laser beam on the sealing member 310 to thereby melt and harden the sealing member 310.

For example, in a vacuum packaging method using laser, to bond the first substrate 20 and the second substrate 30 by using the sealing member 310, the sealing member 310, e.g., a glass frit, may be coated to a predetermined thickness along an edge of the first substrate 20 and may be heated so as to be preliminarily plasticized, thereby removing binder components or the like in the glass frit. Thereafter, the second substrate 30 may be aligned on the first substrate 20, and the aligned first and second substrates 20 and 30 may be inserted into a firing furnace in a vacuum state and then may be bonded to each other by locally heating only a glass frit-coated portion with a laser beam at an appropriate temperature that is a melting point of the glass frit or less to melt the glass frit.

However, in the vacuum packaging method using laser, a plurality of bubbles may be generated when the sealing member 310 is melted by irradiating a laser beam thereon. A part from which bubble generation sources, such as humidity, binder components, or the like, are sufficiently removed in a preliminarily plasticizing operation may be about 30 µm to about 40 µm from a surface of the sealing member 310. The bubble generation sources may not be sufficiently removed from the inside of the part. Thus, a plurality of bubbles may be generated when the sealing member 310 is melted. The plurality of bubbles may be generated when pin-holes trapped inside the sealing member 310 are swollen due to a pressure difference inside the firing furnace in the vacuum state according to the melting of the sealing member 310 by a laser beam or when gas is generated while a small amount of binder components remaining in the preliminarily plasticizing operation without being removed is burned. When the plurality of bubbles generated in the sealing member 310 are located in bonding surfaces between the first and second substrates 20 and 30 and the sealing member 310, an effective bonding area between the first and second substrates 20 and 30 and the sealing member 310 may be reduced. Accordingly, an adhesive strength may be lowered. The plurality of bubbles generated in the sealing member 310 may be intensively located between the first substrate 20 and the sealing member 310, i.e., in a lower region of the sealing member 310 from which the bubble generation sources are not sufficiently removed. By removing the bubbles located between an upper surface of the first substrate 20 and the lower region of the sealing member 310 or by elevating the bubbles arranged between the upper surface of the first substrate 20 and the lower region of the sealing member 310 to an upper region of the sealing member 310, the reduction of the effective bonding area between the first substrate 20 and the sealing member 310 may be prevented or minimized.

Figure 3A:
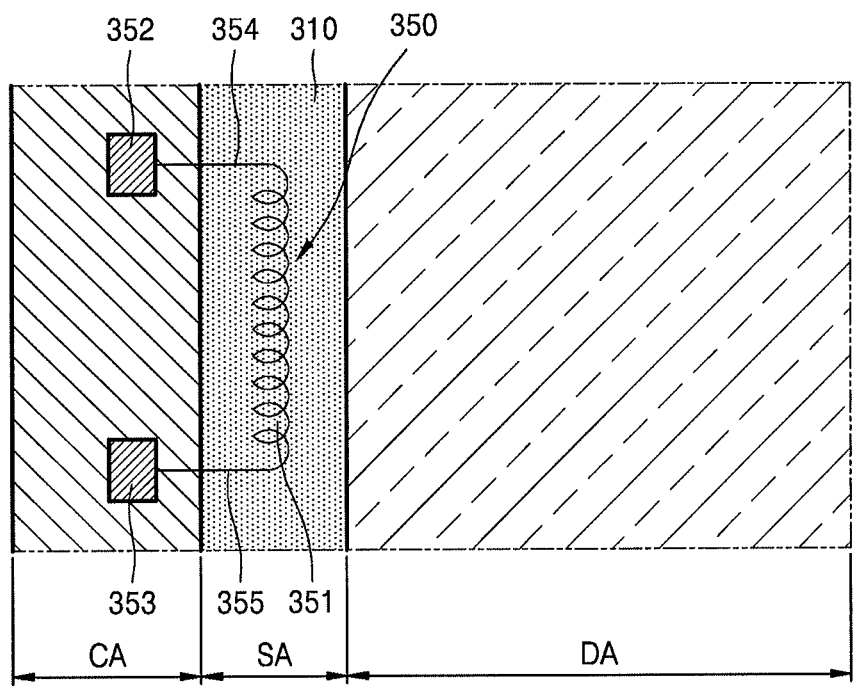
FIG. 3A illustrates a schematic top view of a portion of the display device of FIG. 1, and FIGS. 3B and 3C illustrate schematic cross-sectional views of the portion of the display device.
Figure 3B:
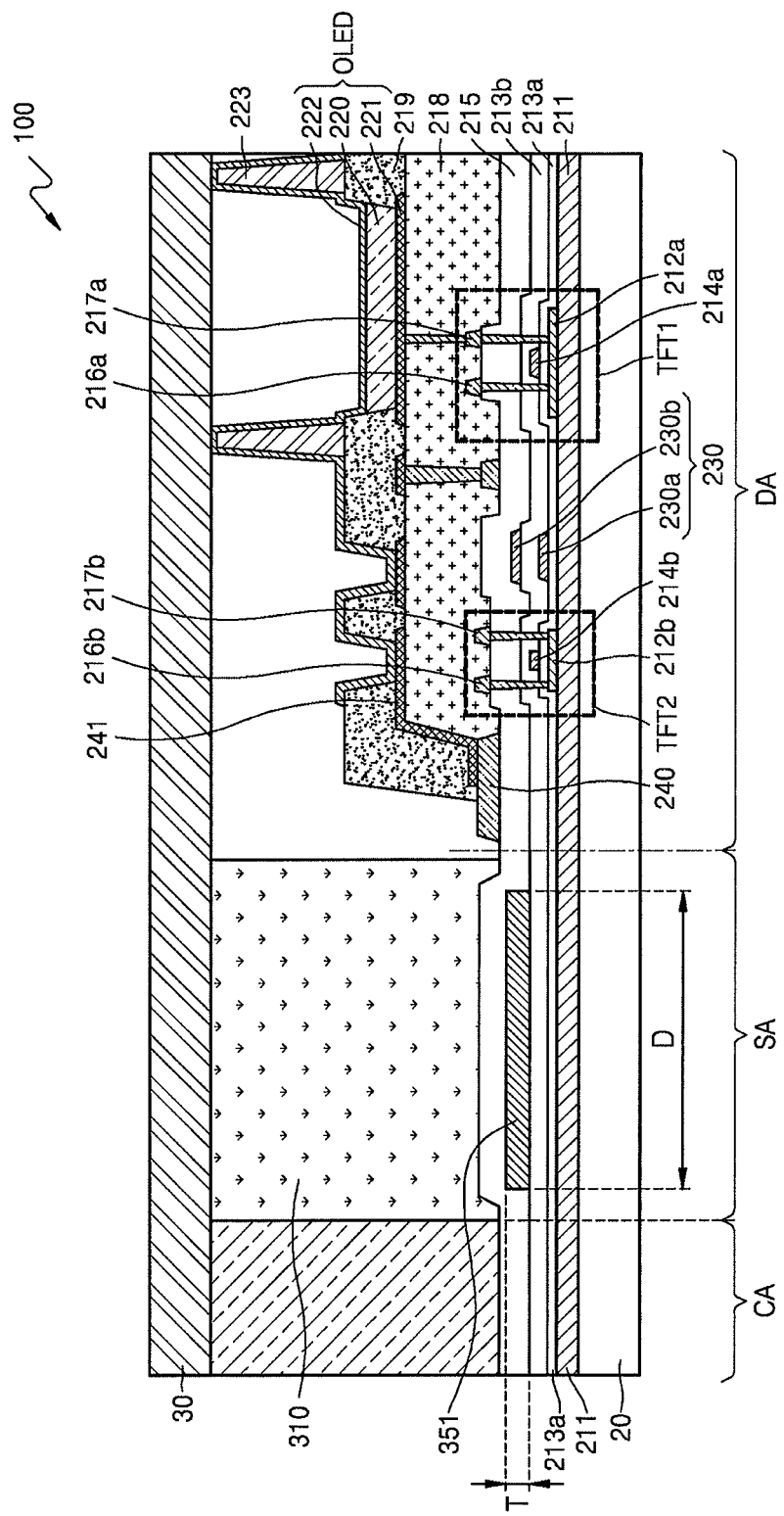

To prevent the reduction of the effective bonding area, the bubbles may be removed or elevated upwards by applying heat to the lower region of the sealing member 310 in which the bubbles are intensively arranged, during a sealing process using a laser beam. Referring to FIGS. 3A and 3B, a heating member 350 capable of applying heat to the lower region of the sealing member 310 may be disposed on the first substrate 20. The heating member 350 may be formed of a heating body capable of applying heat to the lower region of the sealing member 310. For example, the heating member 350 may include a heating part 351 formed of a metal having a high resistance and first and second electrode parts 352 and 353 disposed at both ends of the heating part 351 and capable of applying a voltage to the heating part 351.

The heating part 351 may be formed with a constant thickness T so as to be able to emit constant heat energy over the entire heating part 351. According to an embodiment, the heating part 351 may be formed with the same width D as that of the sealing member 310 and with a constant thickness T and may be disposed below the sealing member 310. Thereby, the heating part 351 may apply a constant heat capacity to the entire lower region of the sealing member 310. In some implementations, the width D and disposition of the heating part 351 may be determined so as to apply a heat capacity to only a portion of the lower region of the sealing member 310 according to shapes and the number of bubbles located in the lower region of the sealing member 310. One or more heating parts 351 may be disposed according to locations to which heat is to be applied. Disposition and widths of a plurality of heating parts 351 will be described below with reference to FIGS. 4A and 4B.

The heating part 351 may be formed of a metal, an alloy, or a combination thereof having a resistance such that heating is achieved when a current flows through the heating part 351. For example, the heating part 351 may be a single- or multi-layer film including Au, Ag, Cu, Ni, Pt, Pd, Al, Mo, Cr, or the like. As another example, the heating part 351 may be formed of a Ni:Cu- or Cu:Ni:Mn-group alloy.

Figure 3C:
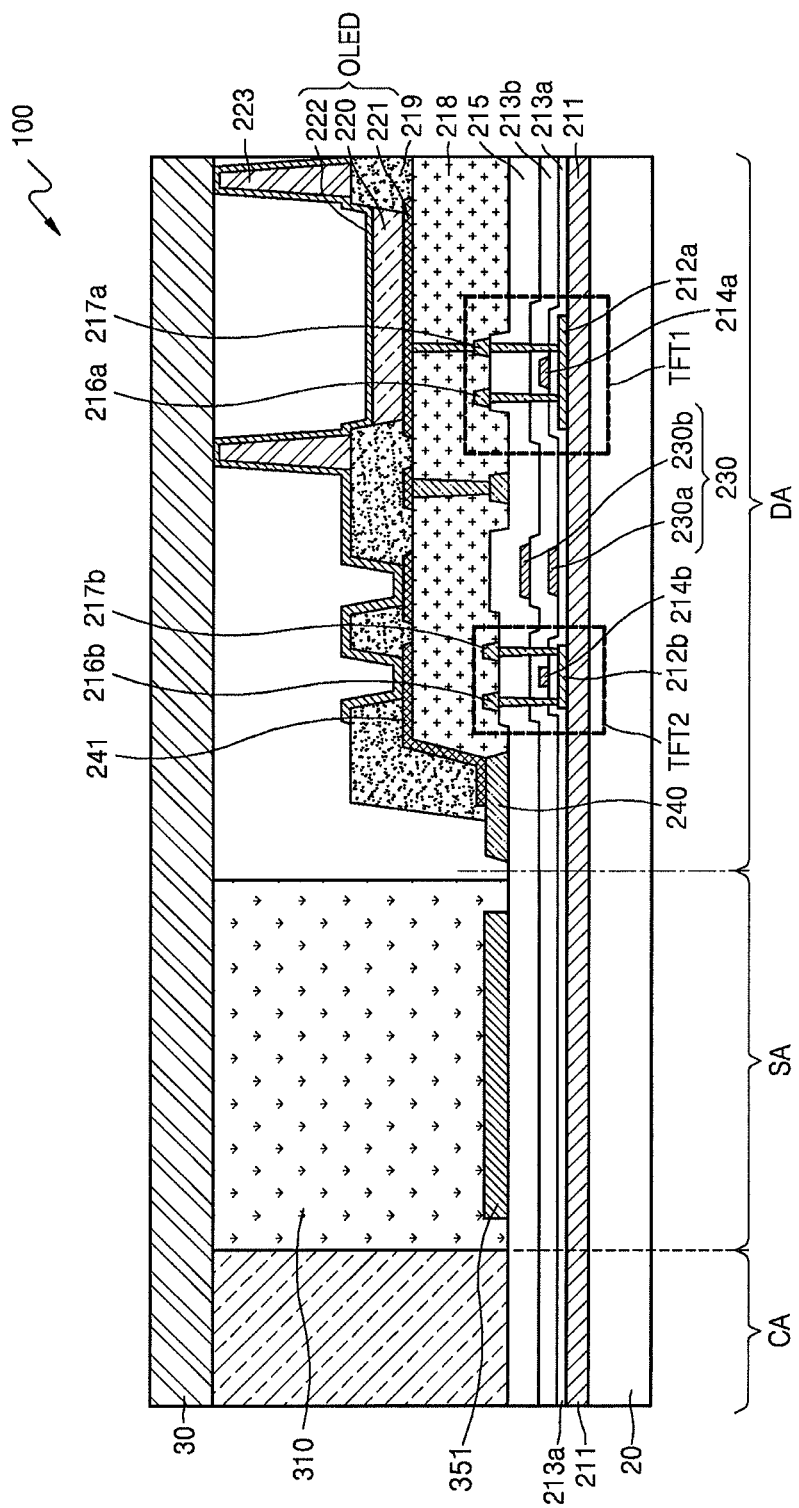

The heating part 351 may be disposed below the sealing member 310 along a length direction of the sealing member 310. For example, the heating part 351 may be disposed between the second gate insulating layer 213b and the interlayer insulating layer 215 and may extend in a length direction of the sealing area SA in which the sealing member 310 is disposed. According to one or more embodiments, the heating part 351 may be disposed between the sealing member 310 and the first substrate 20. For example, as shown in FIG. 3C, the heating part 351 may be disposed between the second gate insulating layer 213b and the sealing member 310.

The first and second electrode parts 352 and 353 may be disposed in the cutting area CA of the display device 100 and may be connected to both ends of the heating part 351 via wirings 354 and 355. When the sealing member 310 in a paste state is melted by irradiating a laser beam onto the sealing member 310, heat may be applied to the lower region of the sealing member 310 by applying a voltage to the first and second electrode parts 352 and 353 connected to the ends of the heating part 351. Accordingly, as described above, the bubbles intensively located between the upper surface of the first substrate 20 and the lower region of the sealing member 310 may be removed or elevated to the upper region of the sealing member 310. According to the removal or elevation of the bubbles between the upper surface of the first substrate 20 and the lower region of the sealing member 310, the effective bonding area between the first substrate 20 and the sealing member 310 may be increased, thereby increasing a mechanical strength of the display device 100.

After completing the sealing process, the first and second electrode parts 352 and 353 may be separated from the display device 100 in a process of cutting the cutting area CA to separate individual display devices.

Figure 4A:
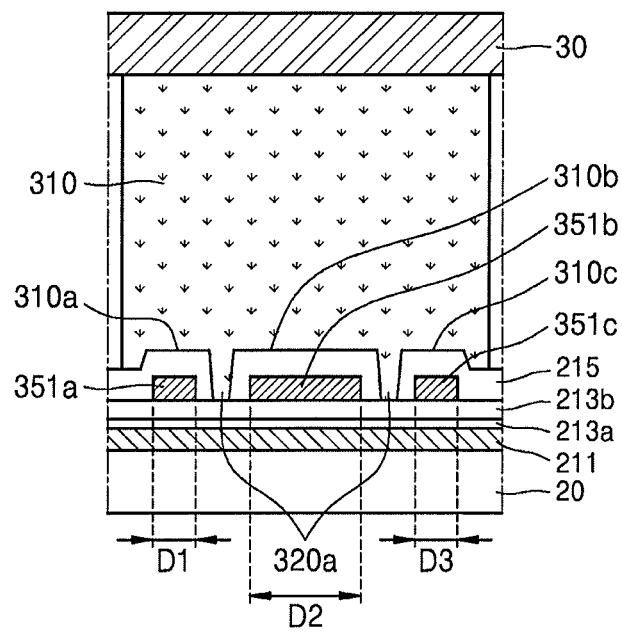
FIGS. 4A and 4B illustrate partial cross-sectional views of a portion of a display device according to another embodiment.
Figure 4B:
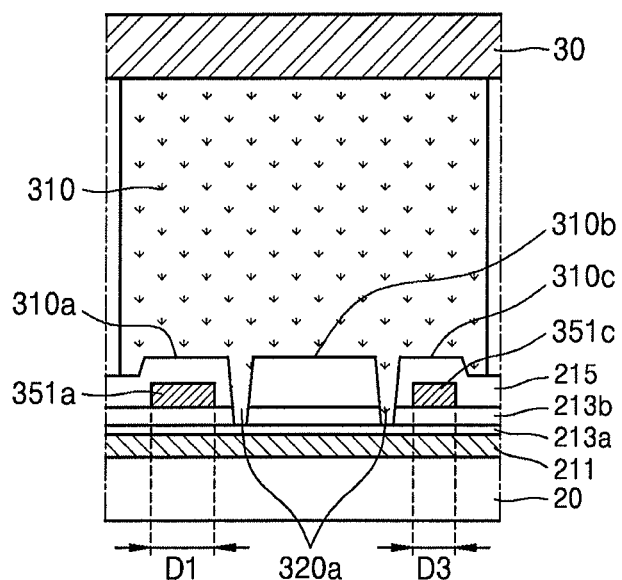

FIGS. 4A and 4B illustrate partial cross-sectional views of the display device 100 according to another embodiment.

When the sealing member 310 is melted by irradiating a laser beam thereon, shapes, sizes, and arrangement of bubbles located in the lower region of the sealing member 310 may vary according to a width of a laser beam and material characteristics of the sealing member 310. As described above, a plurality of heating parts 351 may be formed. The first and second electrode parts 352 and 353 may be individually connected to each of the plurality of heating parts 351.

Referring to FIG. 4A, a first heating part 351a, a second heating part 351b, and a third heating part 351c may be disposed below the sealing member 310 with a predetermined gap therebetween. According to the disposition of the first, second, and third heating parts 351a, 351b, and 351c with the predetermined gap therebetween, heat may be individually applied to the lower region of the sealing member 310 below which the first, second, and third heating parts 351a, 351b, and 351c are disposed, according to sections at which the first, second, and third heating parts 351*a*, 351*b*, and 351*c* are disposed. Therefore, bubbles located in the lower region of the sealing member 310 may be efficiently removed or elevated towards the upper region of the sealing member 310 by adjusting the disposition of the first, second, and third heating parts 351*a*, 351*b*, and 351*c* according to shapes, sizes, and location of the bubbles in the lower region of the sealing member 310. The number of heating parts 351 may differ from three. For example, one or more heating parts 351 may be disposed with a predetermined gap therebetween according to circumstances.

According to a mechanical strength characteristic of the display device 100 sealed by using a laser beam and bonding between the sealing member 310 and the first and second substrates 20 and 30, a relatively large number of bubbles may be formed at both end portions 310*a* and 310*c* of the sealing member 310. In this case, a relatively larger heat capacity may be applied to the end portions 310*a* and 310*c* of the sealing member 310 than to a center portion 310*b* of the sealing member 310 by respectively disposing only the first and third heating parts 351*a* and 351*c* below the end portions 310*a* and 310*c* of the sealing member 310 or adjusting widths of the first, second, and third heating parts 351*a*, 351*b*, and 351*c*.

For example, referring to FIG. 4B, heat may be directly applied to the end portions 310*a* and 310*c* of the sealing member 310 by respectively disposing the first and third heating parts 351*a* and 351*c* respectively having predetermined widths D1 and D3 below the both end portions 310*a* and 310*c* of the sealing member 310. In this case, the widths D1 and D3 of the first and third heating parts 351*a* and 351*c* may be determined according to a heat capacity to be applied to the sealing member 310. For example, if a heat capacity to be applied to one end portion 310*a* of the sealing member 310 is larger than that to be applied to the other end portion 310*c* of the sealing member 310, the width D1 of the first heating part 351*a* may be formed larger than the width D3 of the third heating part 351*c*. In some implementations, the width D3 of the third heating part 351*c* may be formed larger than the width D1 of the first heating part 351*a*, or the widths D1 and D3 of the first and third heating parts 351*a* and 351*c* may be the same.

A plurality of openings 320*a* for increasing the effective bonding area may be formed between the sealing member 310 and the first substrate 20 in the sealing area SA. The plurality of openings 320*a* may be formed through the heating part 351, the second gate insulating layer 213*b*, and the interlayer insulating layer 215. In some implementations, the plurality of openings 320*a* may be formed through at least one of the heating part 351, the second gate insulating layer 213*b*, and the interlayer insulating layer 215. In some implementations, the plurality of openings 320*a* may be omitted.

By way of summation and review, upper and lower substrates in an organic light-emitting display device may be sealed to each other to protect organic light-emitting diodes therein from the outside. To this end, a plurality of substrates are bonded by interposing a sealing member between upper and lower substrates and applying a predetermined energy thereto to melt the sealing member. In this case, a structural strength of a sealed portion should remain constant.

Embodiments provide a display device wherein an adhesive force between upper and lower substrates may be improved, thereby improving the durability and reliability of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device having a display area and a sealing area, the display device comprising:
   a first substrate;
   a second substrate that covers the first substrate;
   a sealing member in the sealing area, the sealing member being between the first and second substrates, the sealing member extending in a first direction between the first and second substrates, and extending in a second direction along an edge of the display area, and extending in a third direction perpendicular to the first direction and the second direction; and
   an electrically conductive part disposed under a lower portion of the sealing member, outermost edges of the lower portion of the sealing member being spaced apart in the third direction by a distance that is greater than an overall span in the third direction of the electrically conductive part in the sealing area.

2. The display device as claimed in claim 1, wherein the electrically conductive part includes plural electrically conductive parts, and widths of the electrically conductive parts are equal.

3. The display device as claimed in claim 1, wherein the electrically conductive part includes plural electrically conductive parts, and widths of the plurality of electrically conductive parts are different from each other.

4. The display device as claimed in claim 1, further comprising an insulating layer between the first substrate and the lower portion of the sealing member, wherein the electrically conductive part includes plural electrically conductive parts, and the electrically conductive parts are positioned between the insulating layer and the lower portion of the sealing member.

5. The display device of claim 1, further comprising a plurality of insulating layers between the first substrate and the lower portion of the sealing member, wherein the electrically conductive part includes plural electrically conductive parts, and the electrically conductive parts are positioned between the insulating layers.

6. The display device as claimed in claim 1, further comprising a pair of electrodes connected to the electrically conductive part, the electrodes being configured to provide a voltage across the electrically conductive part so as to generate heat in the electrically conductive part.

7. The display device as claimed in claim 6, wherein the electrodes are adjacent to a cutting area of the display device, the cutting area being an area outward of the sealing area relative to the display area.

8. The display device as claimed in claim 1, wherein the electrically conductive part is in a form of a single-layer or multi-layer film including at least one or more of gold (Au), silver (Ag), copper (Cu), nickel (Ni), platinum (Pt), palladium (Pd), aluminum (Al), molybdenum (Mo), chromium (Cr), a Ni:Cu alloy, or a Cu:Ni:manganese (Mn) alloy.

9. The display device as claimed in claim 1, wherein the electrically conductive part includes plural electrically conductive parts, an opening is between the electrically conductive parts, and the sealing member contacts the first substrate through the opening.

* * * * *